US012101875B2

(12) United States Patent
Kopp et al.

(10) Patent No.: US 12,101,875 B2
(45) Date of Patent: Sep. 24, 2024

(54) DOUBLE STUB TRANSMISSION LINE FOR SUPPRESSION OF HARMONICS

(71) Applicant: Hewlett Packard Enterprise Development LP, Houston, TX (US)

(72) Inventors: David P. Kopp, Ft. Collins, CO (US); Karl J. Bois, Ft. Collins, CO (US); Steven J. Martin, Las Cruces, NM (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 567 days.

(21) Appl. No.: 17/362,734

(22) Filed: Jun. 29, 2021

(65) Prior Publication Data
US 2022/0418093 A1 Dec. 29, 2022

(51) Int. Cl.
*H03H 7/38* (2006.01)
*G11C 5/04* (2006.01)
*H01P 1/203* (2006.01)
*H05K 1/02* (2006.01)
*H05K 3/00* (2006.01)

(52) U.S. Cl.
CPC ............. *H05K 1/0233* (2013.01); *G11C 5/04* (2013.01); *H01P 1/203* (2013.01); *H03H 7/38* (2013.01); *H05K 3/0005* (2013.01); *H05K 2201/10159* (2013.01)

(58) Field of Classification Search
CPC ... H03H 7/38; H01P 1/02; H01P 1/203; H01P 3/08; H01P 3/081; H01P 3/082; H01P 3/084; H01P 3/085; H01P 3/087; H01P 3/088; H01P 7/08; H01P 7/082; H01P 7/084; H01P 7/088
See application file for complete search history.

(56) References Cited

U.S. PATENT DOCUMENTS

| | | | | |
|---|---|---|---|---|
| 3,662,294 A | * | 5/1972 | Jacobs | H03H 7/383 333/202 |
| 5,023,866 A | * | 6/1991 | De Muro | H01P 1/2056 370/290 |
| 8,933,765 B2 | * | 1/2015 | Akasegawa | H03F 3/193 333/204 |
| 2015/0280778 A1 | * | 10/2015 | Ding | H05K 3/10 29/846 |
| 2021/0126331 A1 | * | 4/2021 | Kitabata | H01P 1/2039 |

OTHER PUBLICATIONS

Amirhosseini et al., "Microstrip Diplexers with Double-Stub Bandpass Filters", International Journal on Communications Antenna and Propagation, vol. 1, No. 1, Feb. 2011, 4 pages.
Chemandy Electronics Ltd, "How does a stub filter work?", available online at <https://chemandy.com/technical-articles/stub-filter/how-does-a-stub-filter-work.htm>, Oct. 30, 2019, 30 pages.

* cited by examiner

*Primary Examiner* — Stephen E. Jones
(74) *Attorney, Agent, or Firm* — Trop, Pruner & Hu, P.C.

(57) ABSTRACT

One aspect provides a printed circuit board (PCB). The PCB includes a transmission line to transmit signals of a desired frequency, a first stub coupled to the transmission line at a first location, and a second stub coupled to the transmission line at a second location. The first stub is to filter out signals of a first frequency, the second stub is to filter out signals of a second frequency, and the first and second stubs are positioned such that an insertion loss of the transmitted signals of the desired frequency is substantially minimized.

20 Claims, 12 Drawing Sheets

DOUBLE STUB TRANSMISSION LINE FOR SUPPRESSION OF HARMONICS

BACKGROUND

Field

This disclosure is generally related to memory modules. More specifically, this disclosure is related to high-speed transmission lines in memory modules.

Related Art

The rapid development in the computing technologies is driving the demand for memories with a higher density and a faster access time. Double data rate (DDR) dynamic random-access memory (DRAM) technology is the mainstream memory technology for its high speed and the ability to individually access the smallest unit of data. With each new generation (e.g., DDR2 to DDR5), the memory modules are providing higher data transfer rates and lower energy consumption. To achieve these goals, the latest DDR technologies (e.g., DDR4 and DDR5) demand higher module density and faster bus speed.

BRIEF DESCRIPTION OF THE FIGURES

In the figures, like reference numerals refer to the same figure elements.

DETAILED DESCRIPTION

The following description is presented to enable any person skilled in the art to make and use the examples, and is provided in the context of a particular application and its requirements. Various modifications to the disclosed examples will be readily apparent to those skilled in the art, and the general principles defined herein may be applied to other examples and applications, without departing from the spirit and scope of the present disclosure. Thus, the scope of the present disclosure is not limited to the examples shown, but is to be accorded the widest scope consistent with the principles and features disclosed herein.

The examples described herein provide a solution for reducing or eliminating higher order harmonics on DDR buses resulting from reflections between dual in-line memory modules (DIMMs) coupled to the bus. More specifically, a DDR bus can include a transmission line carrying the high-speed signals and a pair of stubs coupled to the transmission line, with the stubs functioning as signal filters. The length of each stub can be designed to filter out particular frequencies. For example, the length of one stub can be designed such that this stub filters out the second order harmonic, and the length of the other stub can be designed such that the it filters out the third order harmonic. In addition, the distance between the two stubs can also be designed to ensure that insertion loss to the fundamental frequency (i.e., the frequency of the desired signals) imposed by the filters can be kept at a minimum.

Figure 1:
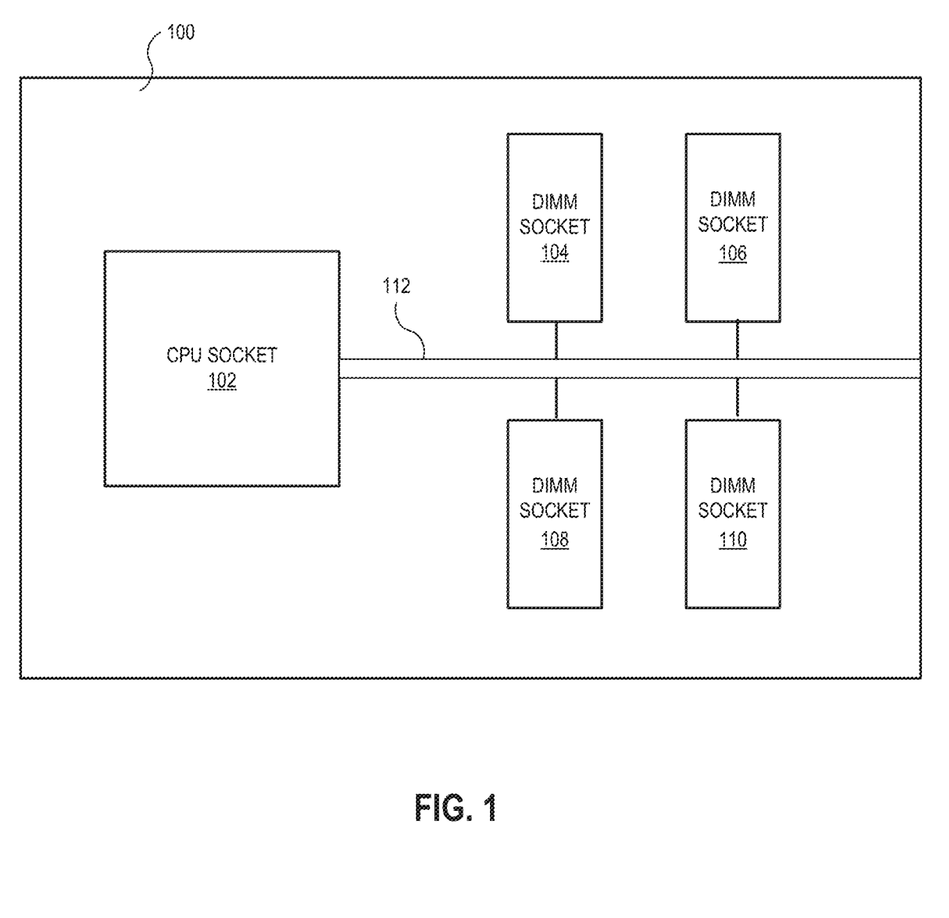
FIG. 1 illustrates a simplified block diagram of a printed circuit board (PCB) for mounting a CPU and a number of DIMM modules.

As the speed of the memory modules increases, routing such high-speed signals between the DDR DIMM modules and the CPU can be challenging, especially when there are multiple DIMM modules coupling to the CPU. FIG. 1 illustrates a simplified block diagram of a printed circuit board (PCB) for mounting a CPU and a number of DIMM modules. PCB 100 includes a socket 102 for mounting a CPU, a number of DIMM sockets (e.g., sockets 104-110), and a bus 112 connecting CPU socket 102 and DIMM sockets 104-110. Single-ended signaling is used to route data signals from DIMM sockets 104-110, meaning that bus 102 carries single-ended signals.

As one can see from FIG. 1, multiple DIMM modules are coupled to bus 112, and the interface between a DIMM socket (e.g., DIMM socket 104) and bus 112 can lead to reflections of the data signals carried by bus 112. Such reflections degrade the available signal at the receivers, resulting in increased data errors (e.g., reading or writing errors). To mitigate the negative effect of the signal reflections, it is desirable to add filters in the signal path to filter out higher order (e.g., second and third orders) harmonics. For example, if DDR4 DIMM modules are coupled to bus 112, the fundamental frequency of the data signal propagating along bus 112 can be 2.8 GHz; then, adding one or more filters along bus 112 to filter out the second order harmonics (i.e., signals of 5.6 GHz) and the third order harmonics (i.e., signals of 8.4 GHz) can significantly improve the quality of data signals, thus reducing the likelihood of data error.

There are various technologies for implementing filters in transmission lines (e.g., striplines or microstrips), such as symmetric electromagnetic band-gap (EBG) structures, resonators, and stub filters. Among these solutions, the stub filters provide the advantage of simplicity in design and fabrication. Conventional stub filters typically include a segment of transmission line with an open end (referred to as a "stub") that is coupled to the signal-carrying transmission line in the vertical direction. However, such a design can be problematic for high-density PCBs where the distance between adjacent traces is smaller than the required length of the stubs.

In some aspects of this application, a number of compact stub filters can be designed and added along the signal path between the DDR modules and the CPU to filter out higher order harmonics. In one aspect, a pair of compact stub filters can be added along the signal path, with one designed to filter out the second-order harmonic and the other designed to filter out the third-order harmonic of the signal.

Figure 2:
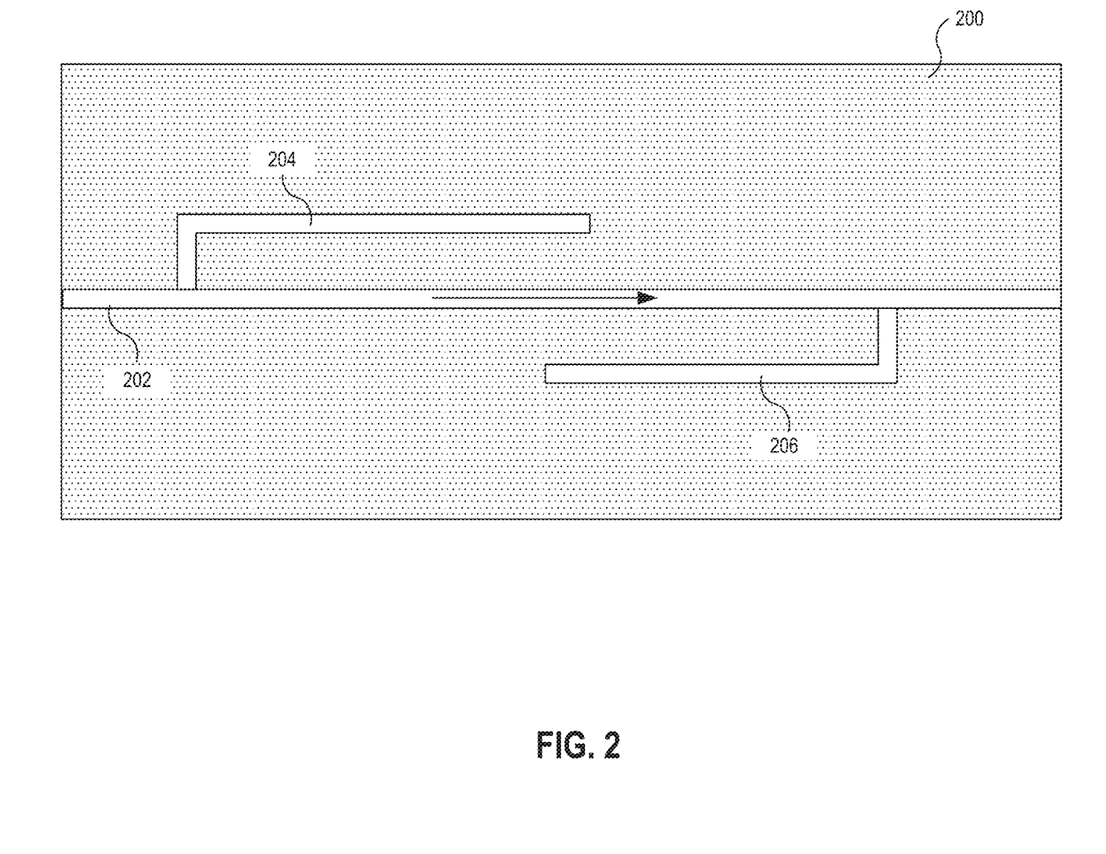
FIG. 2 illustrates a partial top-view of a PCB, according to one aspect of this application.

FIG. 2 illustrates a partial top-view of a PCB, according to one aspect of this application. In FIG. 2, PCB 200 can include a transmission line 202 and a pair of stubs, stubs 204 and 206. PCB 200 can be designed and fabricated using any known standard method, and PCB 200 can be a single layer PCB or a multilayer PCB. Transmission line 202 carries single-ended signals that propagate along the length of transmission line 202, as indicated by the arrow. Depending on the implementation, transmission line 202 can be either a stripline that is surrounded by dielectric material suspended between two ground plane layers within the PCB, or a microstrip positioned on an external layer of the PCB. The scope of this disclosure is not limited by the structure or fabrication means of the PCB and the type of transmission line.

Stubs 204 and 206 are segments of transmission lines having an open end. More specifically, one end of each stub is coupled to transmission line 202 and the other end of each stub does not couple to anything. In this example, stubs 204 and 206 and transmission line 202 are of the same type and are positioned on the same layer of PCB 200. In other words, if transmission line 202 is a stripline, stubs 204 and 206 are also striplines; and if transmission line 202 is a microstrip, stubs 204 and 206 are also microstrips. In a different example, the stubs or one of the stubs can be positioned on a different layer. For example, transmission line 202 can be positioned on the top layer of PCB 200 and stubs 204 and 206 can be positioned on a middle layer of PCB 200, or vice versa. In such situations, stubs 204 and 206 can be coupled to transmission line 202 using vias. Placing the stubs on a different layer than that of the transmission line can reduce the occupied board space on the particular layer of the transmission line. In an alternative example, transmission line 202 and stub 204 can be placed on the top layer, whereas stub 206 can be placed on the middle layer.

In the example shown in FIG. 2, each stub can be shaped like an "L," with the shorter leg of the L intercepting vertically with transmission line 202 and the longer leg of the L extending in a direction that is parallel to transmission line 202. Moreover, stubs 204 and 206 are coupled to the different sides of transmission line 202, with their longer legs extending in opposite directions facing each other. One can describe each stub as being folded and the two stubs being folded in opposite directions facing each other. This way, the overall footprint of the filter structure can be reduced.

Figure 3A:
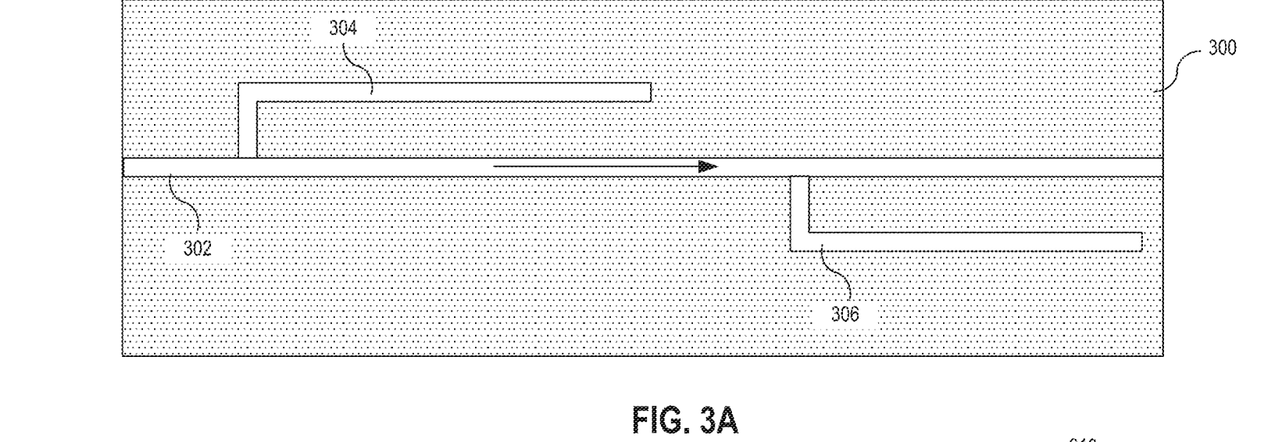
FIG. 3A illustrates a partial top-view of a PCB, according to one aspect of this application.

Other than what is shown in FIG. 2, there are different arrangements of the location and/or orientation of the stubs. FIG. 3A illustrates a partial top-view of a PCB, according to one aspect of this application. In FIG. 3A, PCB 300 can include a transmission line 302 and stubs 304 and 306. Like stubs 204 and 206 shown in FIG. 2, stubs 304 and 306 are located on opposite sides of transmission line 302 and are also folded. However, unlike stubs 204 and 206 that are folded in opposite directions, stubs 304 and 306 are folded in the same direction. The longer legs of stubs 304 and 306 extend in the same direction.

Figure 3B:
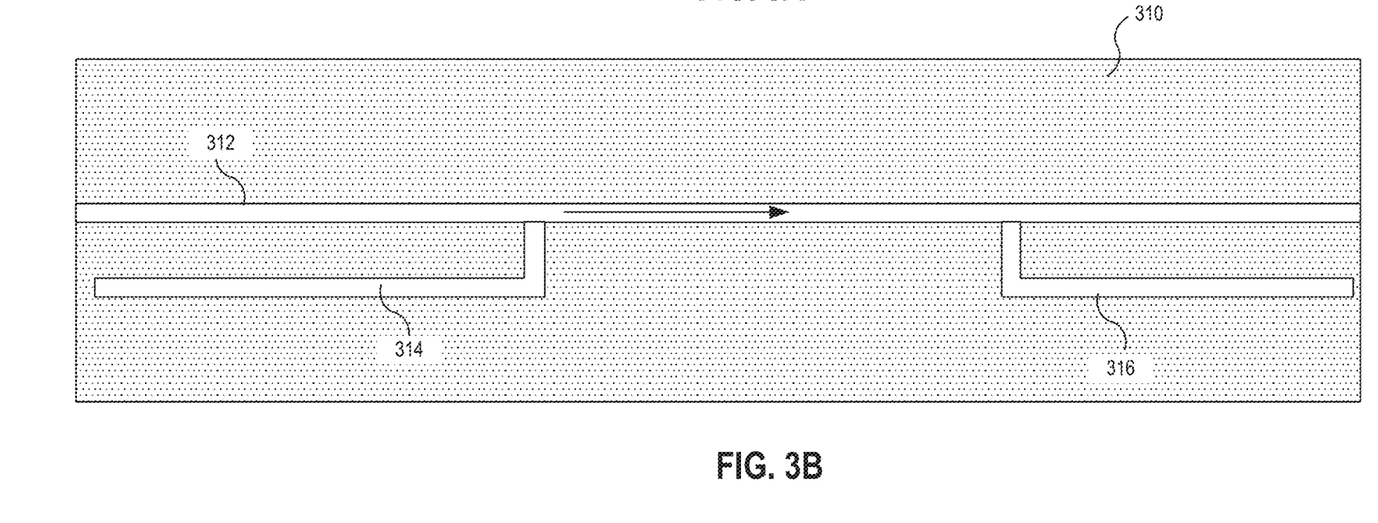
FIG. 3B illustrates a partial top-view of a PCB, according to one aspect of this application.

FIG. 3B illustrates a partial top-view of a PCB, according to one aspect of this application. In FIG. 3B, PCB 310 can include a transmission line 312 and stubs 314 and 316. Unlike the stubs shown in FIG. 2 and FIG. 3A, stubs 314 and 316 are located on the same side of transmission line 312. Stubs 314 and 316 are also folded in opposite directions. However, unlike stubs 204 and 206 that are folded in opposite directions facing each other, stubs 304 and 306 are folded in opposite directions facing away from each other. The longer legs of stubs 314 and 316 extend in opposite directions, away from each other.

Figure 3C:
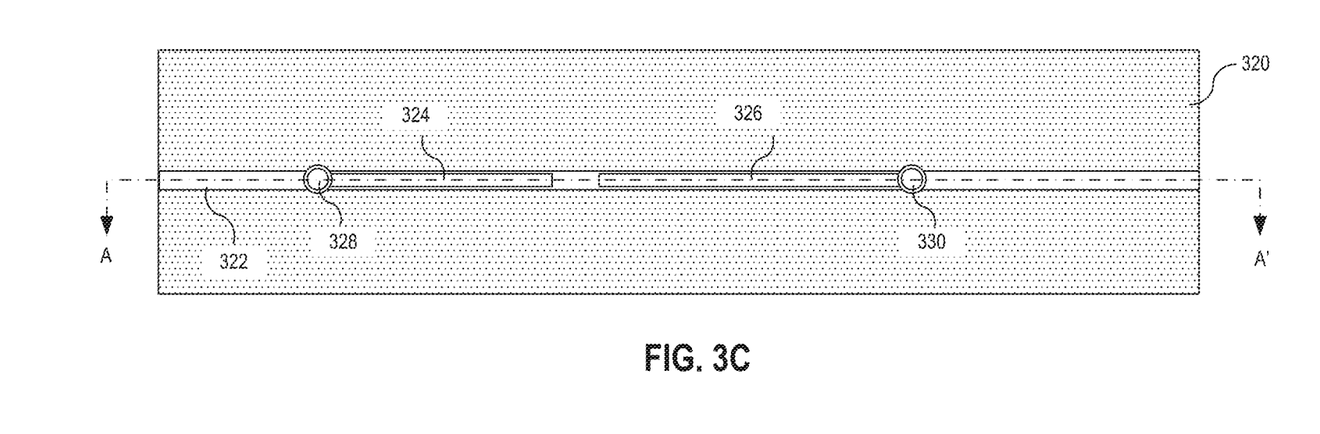
FIG. 3C illustrates a partial top-view of a PCB, according to one aspect of this application.

FIG. 3C illustrates a partial top-view of a PCB, according to one aspect of this application. In FIG. 3C, PCB 320 can include a transmission line 322 and stubs 324 and 326. Unlike the examples shown in FIGS. 3A-3B, stubs 324 and 326 are positioned on a layer different from the layer of transmission line 322. More specifically, transmission line 322 is positioned on the top layer of PCB 320, whereas stubs 324 and 326 are positioned on a layer below the top layer. FIG. 3C also shows the vias connecting the stubs to transmission line 322. Via 328 connects stub 324 to transmission line 322, and via 330 connects stub 326 to transmission line 322. Note that, when computing the respective lengths of stubs 324 and 326, one needs to consider the small but non-negligible electrical path length of the vias, which should be included when calculating the quarter wavelength. Also note that the quarter wavelength for microstrips (e.g., stubs in FIGS. 3A-3B) and striplines (e.g., stubs in FIGS. 3C-3D) are computed using different average dielectric constant and, hence, they can have different values.

Figure 3D:
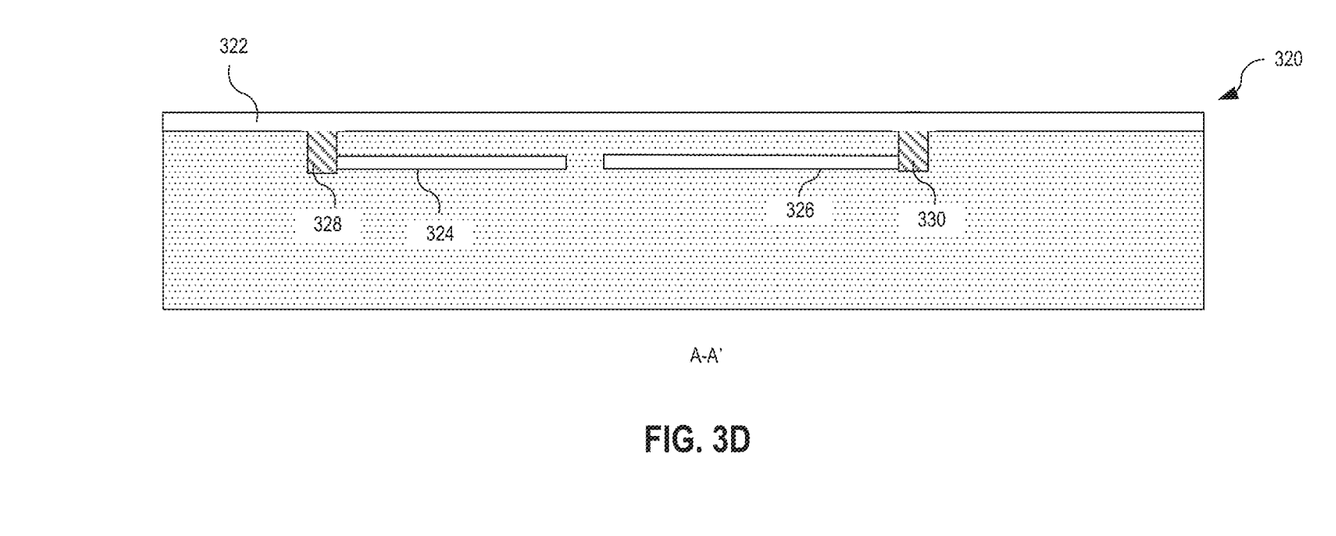
FIG. 3D illustrates the cross-sectional view of PCB 320 along cutting-plane A-A', according to one aspect of this application.

FIG. 3D illustrates the cross-sectional view of PCB 320 along cutting-plane A-A', according to one aspect of this application. PCB 320 can be a multilayer PCB that comprises one or more core layers and multiple metal layers, with adjacent metal layers being separated by a dielectric layer. For simplicity of illustration, the detailed layer structure is not shown in FIG. 3D, and only a portion of the layered structure of PCB 320 is shown.

In the example shown in FIGS. 3C-3D, stubs 324 and 326 are on the same layer and are extending toward each other. It is possible to have the stubs extending away from each other (e.g., similar to what is shown in FIG. 3B), or to have the stubs extending toward the same direction (e.g., similar to what is shown in FIG. 3A) to prevent them from overlapping each other. In an alternative example, it is also possible to place the two stubs on two different layers.

Note that the arrangements shown in FIG. 2 and FIGS. 3A-3D are not exhaustive. Other arrangements not shown are also possible. The characteristics of the filters depend on the length of each stub as well as the distance (also referred to as the pitch-between-stubs) between the locations where the two stubs couple to the transmission line.

For an open-circuit stub, to generate a "null" at a particular wavelength in the transmission spectrum (i.e., to filter out the particular wavelength), the length of the stub should be about a quarter wavelength away. Assuming that the dielectric constant of the surrounding material is a constant, one can calculate in theory the length of the stub. However, considering the finite dimension of the copper traces (i.e., the stubs and the main transmission line), to achieve the desired filtering effect, the length of each stub needs to be fine-tuned. In some aspects of this application, a high-frequency structure simulator (HFSS) tool can be used to run a simulation to determine the actual length of the stubs.

Figure 4:
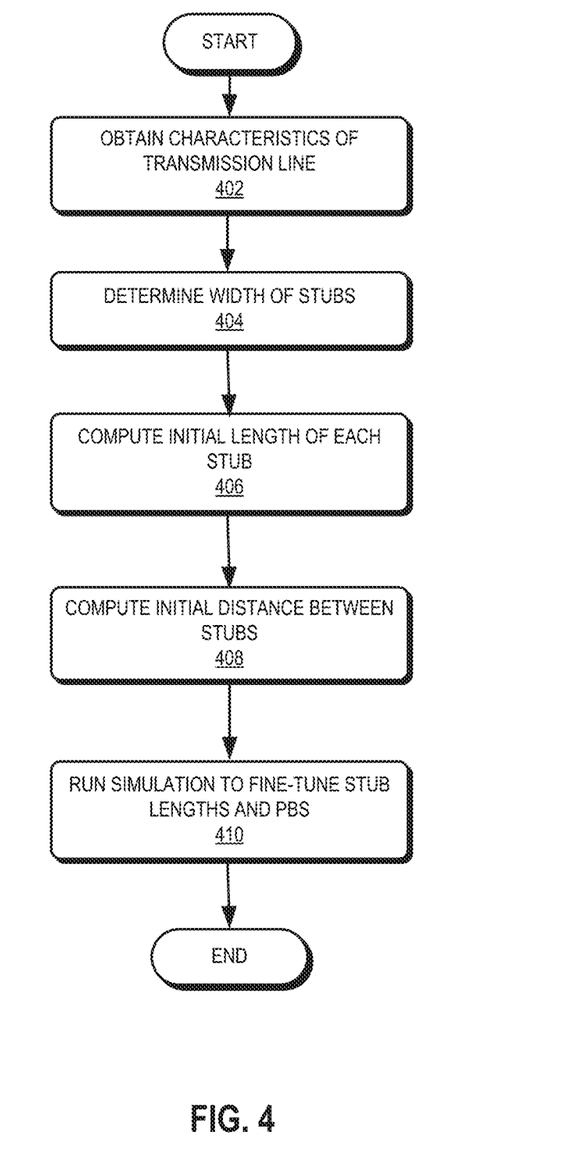
FIG. 4 presents a flowchart illustrating an exemplary process of designing stub filters, according to one aspect of this application.

FIG. 4 presents a flowchart illustrating an exemplary process of designing stub filters, according to one aspect of this application. During operation, the characteristics of a transmission line are obtained (operation 402). The transmission line is to carry signals of a desired frequency and stub filters are to be added to the transmission line to filter out unwanted frequencies (e.g., second and third order harmonics). In one aspect of this application, the transmission line can be part of a PCB on which a processing unit (e.g., a CPU) and multiple memory modules (e.g., DDR DIMMs) are mounted, and the transmission line can be a bus line coupling the multiple memory modules to the processing unit. In one aspect of this application, the transmission line can be the data bus. The transmission line can be on the top layer or a middle layer of the PCB. The characteristics of the transmission line can include its thickness and width.

One can subsequently determine the width of the stubs (operation 404). Note that the width of the transmission line is typically determined by other constraints (e.g., trace density, loss, etc.). In some aspects of this application, the width of the stubs can be the same as that of the transmission line. Alternatively, the width of the stubs can be different from that of the transmission line. For example, since transmission loss is not of concern for stubs, the stubs can be narrower than the transmission line. When multiple stubs are used, these stubs can have the same or different widths. In some aspects of this application, the width of a stub can be between the one-half of the width of the main transmission line and the width of the main transmission line.

The initial length of each stub can be computed based on the wavelength of the to-be-filtered signal and the dielectric constant of material around the transmission line (operation 406). For example, for DDR4 application, the fundamental frequency of the data signal propagating along the data bus is 2.8 GHz. Using 3.8 as a good approximation of the dielectric constant of the dielectric material surrounding the transmission line, one can compute the quarter wavelength of the second order harmonic (i.e., 5.6 GHz) as 6.87 mm or 270 mils. Similarly, the quarter wavelength of the third order harmonic (i.e., 8.4 GHz) can be computed as 4.58 mm or 180 mils. For the double stub design, one can also calculate the initial distance between the two stubs (operation 408). In some aspects of this application, the distance between the two stubs can be calculated theoretically as the sum of the lengths of the two stubs. In the above example of filtering out second and third harmonics, the distance between the two stubs can be 450 mils, which is the sum of the theoretical lengths of the two stubs. The distance between the two stubs (i.e., the pitch-between-stubs) affects the insertion loss to the fundamental frequency. A carefully selected value for the pitch-between-stubs can ensure the minimum insertion loss to the fundamental frequency.

The calculated lengths of the stubs and the distance between the stubs can be fine-tuned by running a simulation (e.g., an HFSS simulation) (operation 410). More specifically, the actual width and thickness of the transmission lines and the stubs are used in the simulation to determine the optimum length of the stubs (i.e., to determine the length of the stub that can cause maximum reflection or minimum transmission at the to-be-filtered frequency). Similarly, the optimum pitch-between-stubs can also be determined from the simulation. Once the optimum lengths of the stubs and the pitch-between-stubs are determined, the PCB designer can place the stubs at appropriate locations on the transmission line (or data bus). Various considerations may be taken (e.g., adjacent devices or traces) based on the overall circuit layout of the PCB. The PCB design can be used to fabricate a motherboard for mounting the CPU and the memory modules, and the quality of data signals between the CPU and the memory modules can be improved due to the implementation of the double-stub filters.

Figure 5A:
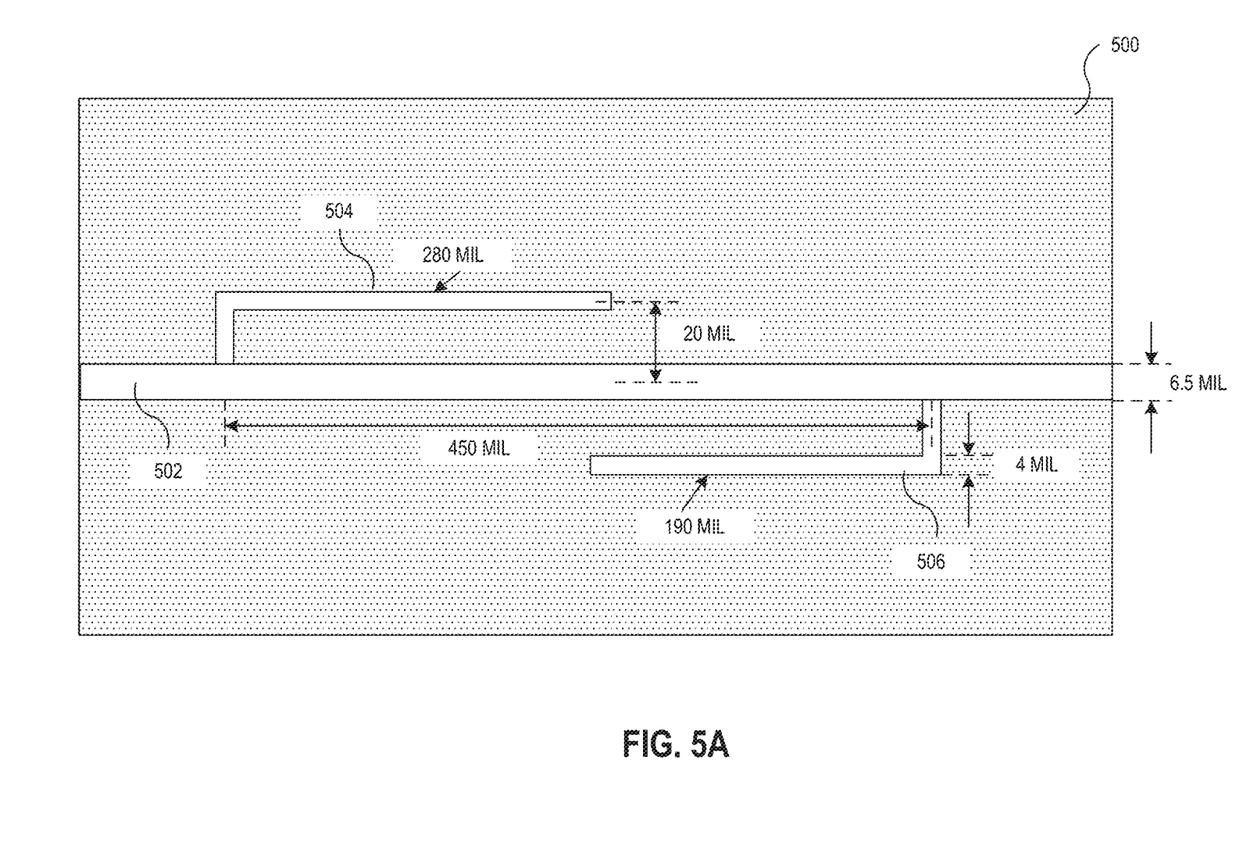
FIG. 5A illustrates a partial top view of an exemplary PCB, according to one aspect of this application.

FIG. 5A illustrates a partial top view of an exemplary PCB, according to one aspect of this application. PCB 500 can include a transmission line 502 and stubs 504 and 506. Similar to the examples shown in FIG. 2 and FIGS. 3A-3B, the top view of transmission line 502 and stubs 504-506 is viewed from the top of the layer where transmission line 502 and stubs 504-506 are situated. Transmission line 502 and the stubs can be located on any layer of a multilayer PCB.

FIG. 5A illustrates in more detail the dimensions of transmission line 502 and stubs 504-506. Note that the drawing is for illustration purposes only and is not drawn to scale. In the example shown in FIG. 5A, the width of transmission line 502 is about 6.5 mil and the width of each stub is roughly 4 mil.

In this example, the fundamental frequency of the signals propagating along transmission line 502 is 2.8 GHz, and the second and third harmonic frequencies are 5.6 GHz and 8.4 GHz, respectively. As discussed previously, the theoretically calculated length of the stub filter for the second order harmonic (i.e., the quarter wavelength of the second order harmonic) is 270 mil, and the theoretically calculated length of the stub filter for the third order harmonic (i.e., the quarter wavelength of the third order harmonic) is 180 mil. FIG. 5A illustrates the actual lengths of the stub filters obtained from running the HFSS simulation. Stub 504, which is designed to filter out the second order harmonic (i.e., 5.6 GHz), has a total length of 280 mil, which substantially approximates to the quarter wavelength of the second order harmonic. Stub 506, which is designed to filter out the third order harmonic (i.e., 8.4 GHz) has a total length of 190 mil, which substantially approximates to the quarter wavelength of the third order harmonic. The distance between the junction points of the two stubs is 450 mil, which substantially approximates to the sum of the quarter wavelengths of the second and third order harmonics. Moreover, the distance between the segment of a stub that runs in parallel with transmission line 502 and transmission line 502 is about 20 mil, which means each L-shaped stub has a vertical segment that is 20 mil long. The length of the parallel segment will be the total length of the stub minus the 20 mil. Note that such a distance needs to be sufficiently large to prevent crosstalk between the stub and transmission line 502. In some aspects of this application, such a distance is at least three times the width of the main transmission line. A larger distance will increase the footprint of the stub filter.

Figure 5B:
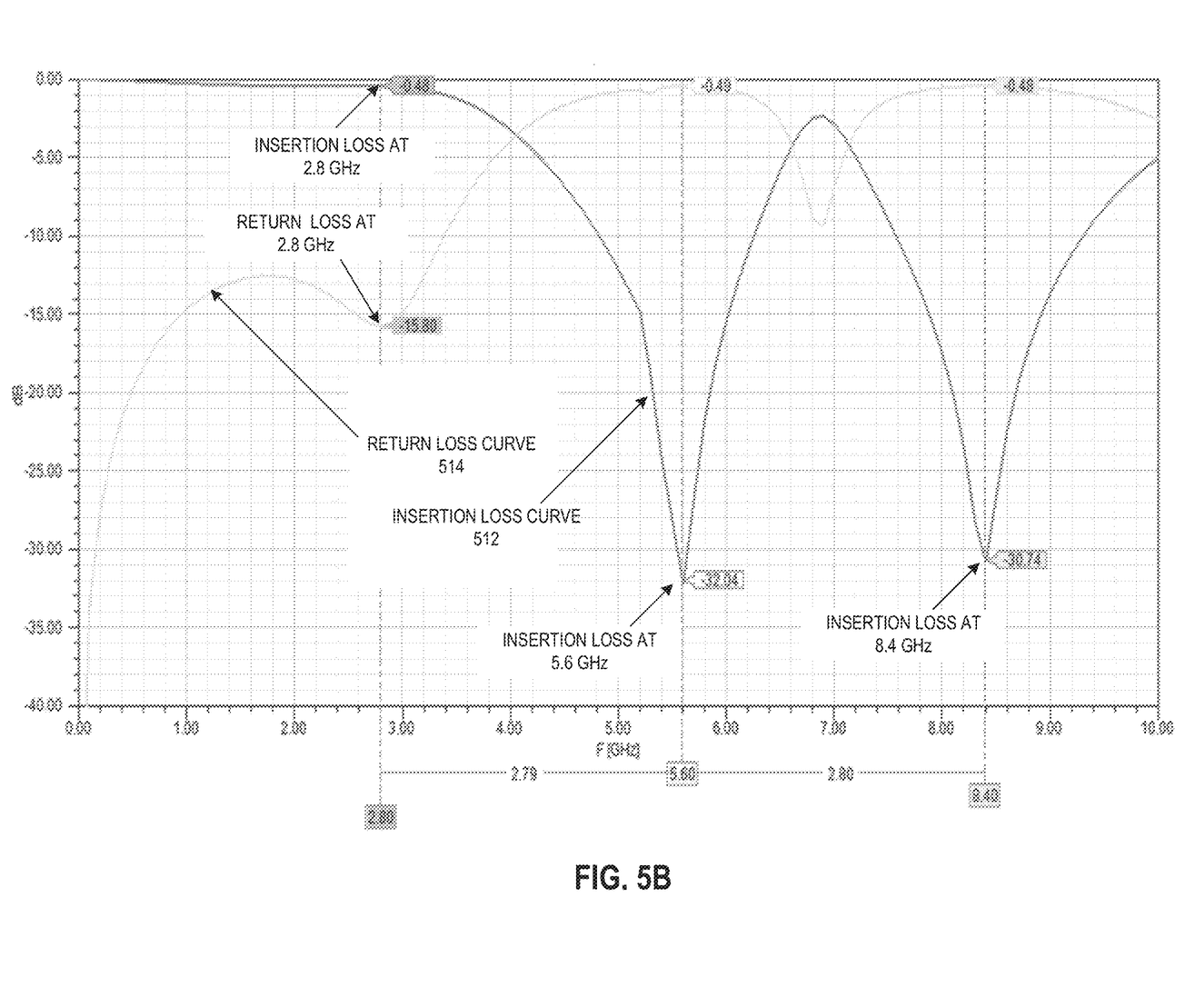
FIG. 5B illustrates simulated scattering parameters for the stub filters shown in FIG. 5A, according to one aspect of this application.

FIG. 5B illustrates simulated scattering parameters for the stub filters shown in FIG. 5A, according to one aspect of this application. More specifically, FIG. 5B shows an insertion loss curve 512 (which plots scattering parameter $S_{21}$ as a function of the signal frequency) and a return loss curve 514 (which plots scattering parameter $S_{11}$ as a function of the signal frequency). One can see from FIG. 5B that there are two dips in insertion loss curve 512, one occurring at 5.6 GHz and one occurring at 8.4 GHz. The insertion loss at these two resonance frequencies is beyond 30 dB. On the other hand, according to insertion loss curve 512, the insertion loss at the fundamental frequency (i.e., 2.8 GHz) is less than 1 dB. In other words, signals at 5.6 GHz and 8.4 GHz (which correspond respectively to the second and third harmonics of the 2.8 GHz signals) can be successfully filtered out, whereas the desired 2.8 GHz is only affected at a minimum level.

One can also see a dip in return loss curve 514 at the fundamental frequency (i.e., 2.8 GHz). The difference in the return loss between the second or third harmonic and the fundamental frequency is greater than 10 dB, which also indicates that the filters can successfully filter out the second- and third-order harmonics without causing significant loss to the fundamental frequency.

Any change to the lengths of the stubs can cause the dips in insertion loss curve 512 to shift their positions. Hence, by tuning the length of each stub, one can filter out signals of unwanted frequencies (e.g., higher order harmonics or other frequencies). For example, if signals of multiple frequencies are injected into a transmission line, a carefully designed stub filter can be used to filter out any unwanted frequency. When there are multiple (e.g., two) stub filters, the pitch-between-stubs can cause the dip(s) in return loss curve 514 to shift.

Figure 5C:
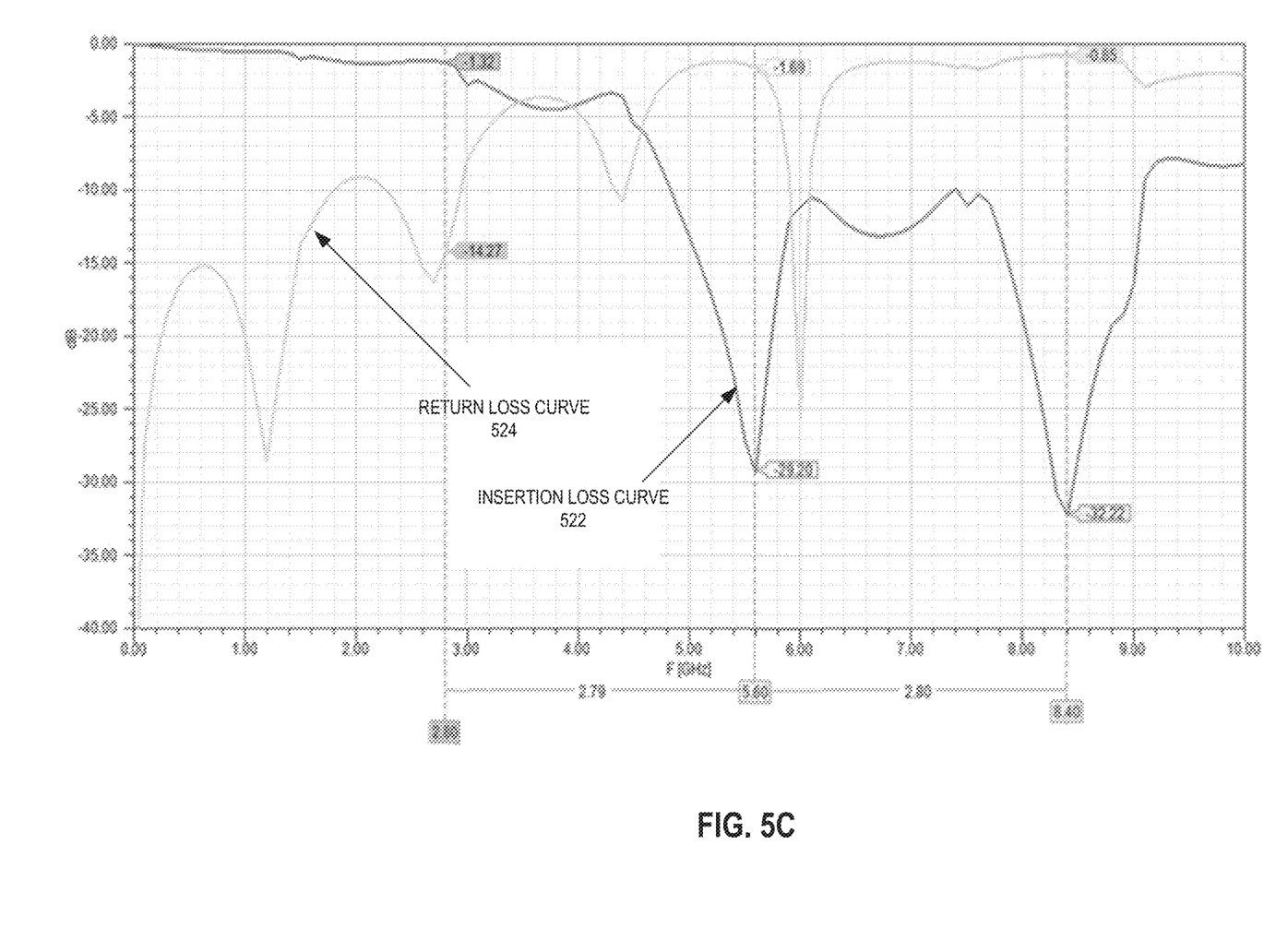
FIG. 5C illustrates simulated scattering parameters for a double-stub filter, according to one aspect of this application.

FIG. 5C illustrates simulated scattering parameters for a double-stub filter, according to one aspect of this application. The simulated double-stub filter can be similar to the one shown in FIG. 5A, except that the pitch-between-stubs is now about 1600 mils. One can see from insertion loss curve 522 that the nulls remain in place at 5.6 GHz and 8.4 GHz (i.e., the second and third harmonics), meaning that adjusting the pitch-between-stubs does not affect the resonance frequencies. However, as the pitch-between-stubs increases, there are now multiple nulls in return loss curve 524. Note that at the fundamental frequency (2.8 GHz), the return loss is slightly higher than what is shown in FIG. 5B, meaning that this pitch-between-stubs can lead to a higher loss of the fundamental frequency.

In the examples shown in FIG. 2, FIGS. 3A-3D, and FIG. 5A, the main transmission line is single-ended. In practice, the double-stub filters can also be applied to differential transmission lines, where a pair of transmission lines is used to carry differential signals. Due to the closeness of the pair of transmission lines, special consideration is needed regarding the placement of the stub filters.

Figure 6A:
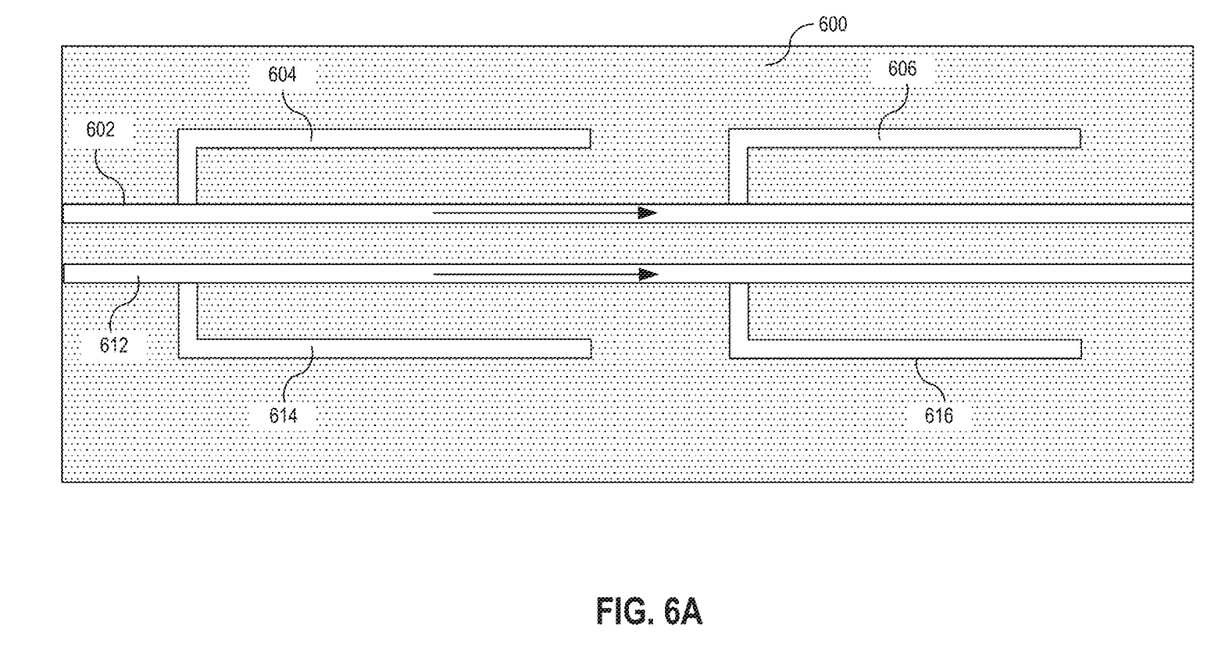
FIG. 6A illustrates a partial top view of an exemplary PCB with differential transmission lines, according to one aspect of this application.

FIG. 6A illustrates a partial top view of an exemplary PCB with differential transmission lines, according to one aspect of this application. In FIG. 6A, PCB 600 includes a pair of differential transmission lines 602 and 612. A double-stub filter comprising stubs 604 and 606 is coupled to transmission line 602, and a double-stub filter comprising stubs 614 and 616 is coupled to transmission line 612. Each double-stub filter can be similar to the ones shown in FIG. 2, FIGS. 3A-3D, and FIG. 5A. The length of each stub and the pitch-between-stubs for each double-stub filter can be carefully designed such that each double-stub filter can filter out the unwanted signals (e.g., higher order harmonics) propagating along the differential transmission lines while only causing minimum loss to the desired signals (e.g., the fundamental frequency and the DC value).

As one can see in FIG. 6A, because differential transmission lines 602 and 612 are adjacent to each other, the stubs of the two double-stub filters are separately located on different sides of the pair of transmission lines. This way, there is no interference or crosstalk caused by the stubs.

Figure 6B:
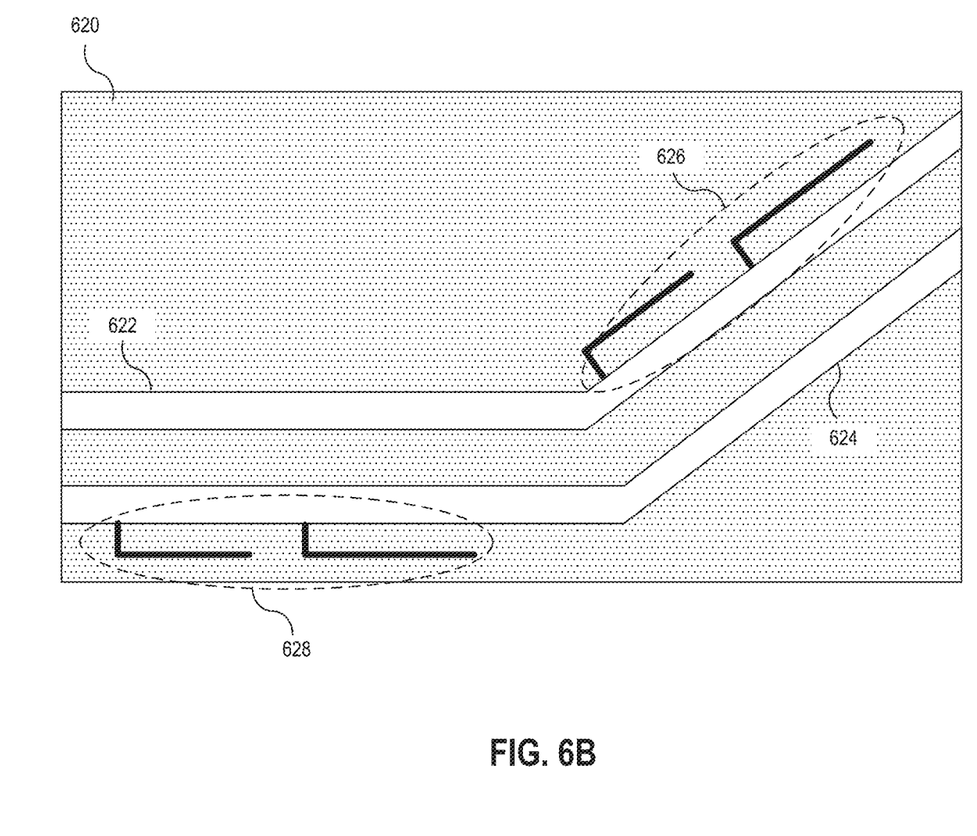
FIG. 6B illustrates a partial top view of an exemplary PCB with differential transmission lines, according to one aspect of this application.

Other placement schemes are also possible. FIG. 6B illustrates a partial top view of an exemplary PCB with differential transmission lines, according to one aspect of this application. In FIG. 6B, PCB 620 includes a pair of differential transmission lines 622 and 624. A double-stub filter 626 is coupled to transmission line 622, and a double-stub filter 628 is coupled to transmission line 624. As shown in FIG. 6B, the positions of double-stub filters 626 and 628 offset each other. More specifically, double-stub filter 626 couples to transmission line 622 at a particular area on PCB 620, whereas double-stub filter 628 couples to transmission line 624 at a different area on PCB 620. Placing the double-stub filters at different areas in the PCB also prevents signal interference. In principle, the double-stub filter can be placed at any location along a signal transmission path. This provides great flexibility in terms of circuit design.

The transmission lines on a PCB typically are not straight. Curves are often added on a transmission path to match impedance or length. Similarly, a stub filter does not need to only include straight segments, as in the examples shown in the drawings. Depending on the layout requirements (e.g., space constraints), it is possible to have stub filters that include curved segments. The actual shape of the stubs does not affect the performance of the double-stub filter, as long as the total length of each stub and the pitch-between-stubs are carefully designed based on the wavelengths of the to-be-transmitted and to-be-filtered signals. In some aspects of this application, one can run the HFSS simulation using the actual shape of the stubs.

Figure 7:
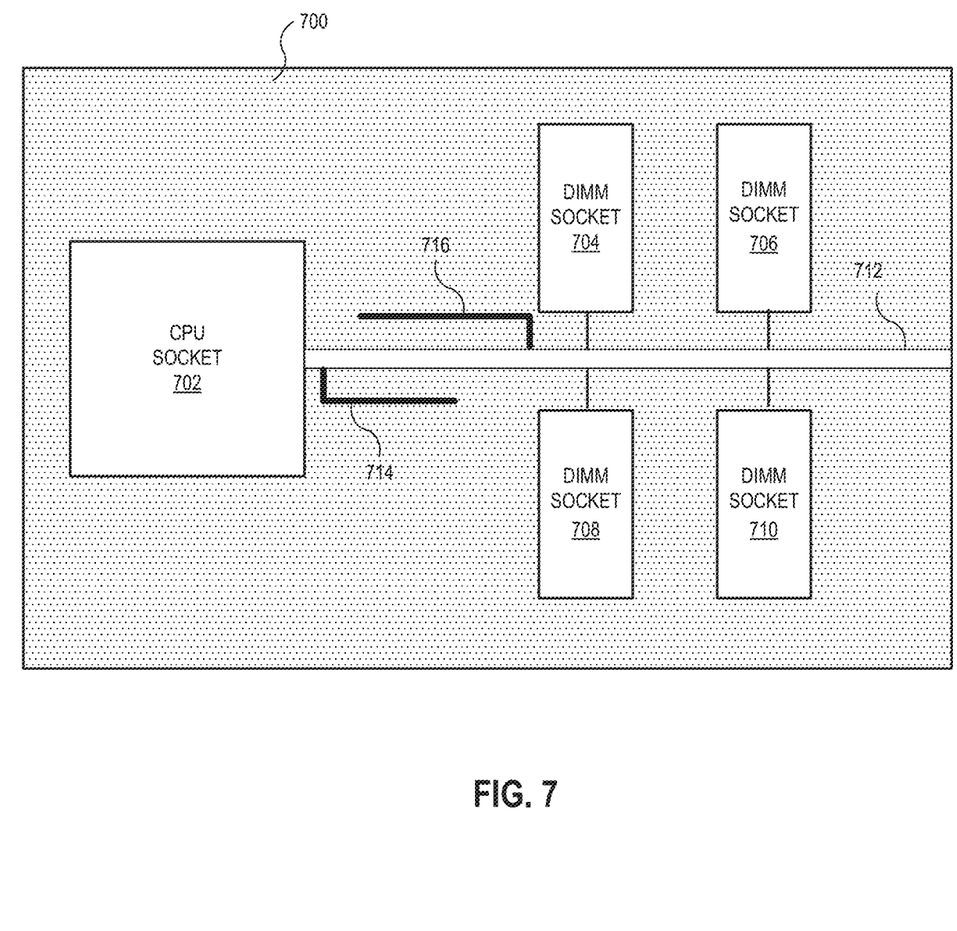
FIG. 7 illustrates a simplified block diagram of a PCB for mounting a CPU and a number of DIMM modules, according to one aspect of this application.

FIG. 7 illustrates a simplified block diagram of a PCB for mounting a CPU and a number of DIMM modules, according to one aspect of this application. PCB 700 includes a CPU socket 702 for mounting a CPU, a number of DIMM sockets (e.g., DIMM sockets 704-710) for mounting DIMM modules, and a single-ended transmission line 712 functioning as a data bus between CPU socket 702 and DIMM sockets 704-710.

L-shaped open stubs 714 and 716 are coupled to transmission line 712. More specifically, the segments of open stubs 714 and 716 that run parallel to transmission line 712 are extending toward each other, thus reducing the overall footprint. The length of stub 716 is designed to filter out the second order harmonic of the data signals transported by transmission line 712 between CPU 702 and the DIMM modules, and the length of stub 714 is designed to filter out the third order harmonic of the data signals.

In the examples discussed in this disclosure, PCB 700 supports DDR4 DIMM modules and the fundamental frequency of the data signals is 2.8 GHz. In practice, the solution can be applied to other DDR technologies, such as DDR5 where the data speed can be even higher (e.g., 4.8 GHz or 6.4 GHz). In addition to DDR applications, the double-stub filters can also be used in other PCB applications where filtering of higher order harmonics is needed. Moreover, if additional frequencies need to be filtered out (e.g., the fourth order harmonic), additional stub filters can be added, as long as the pitch-between-stubs is carefully designed to ensure minimum loss to the fundamental frequency. More generally, the stub filters can be designed to filter any unwanted frequency, which may not be a higher order harmonic of a desired signal propagating along the transmission line.

Figure 8:
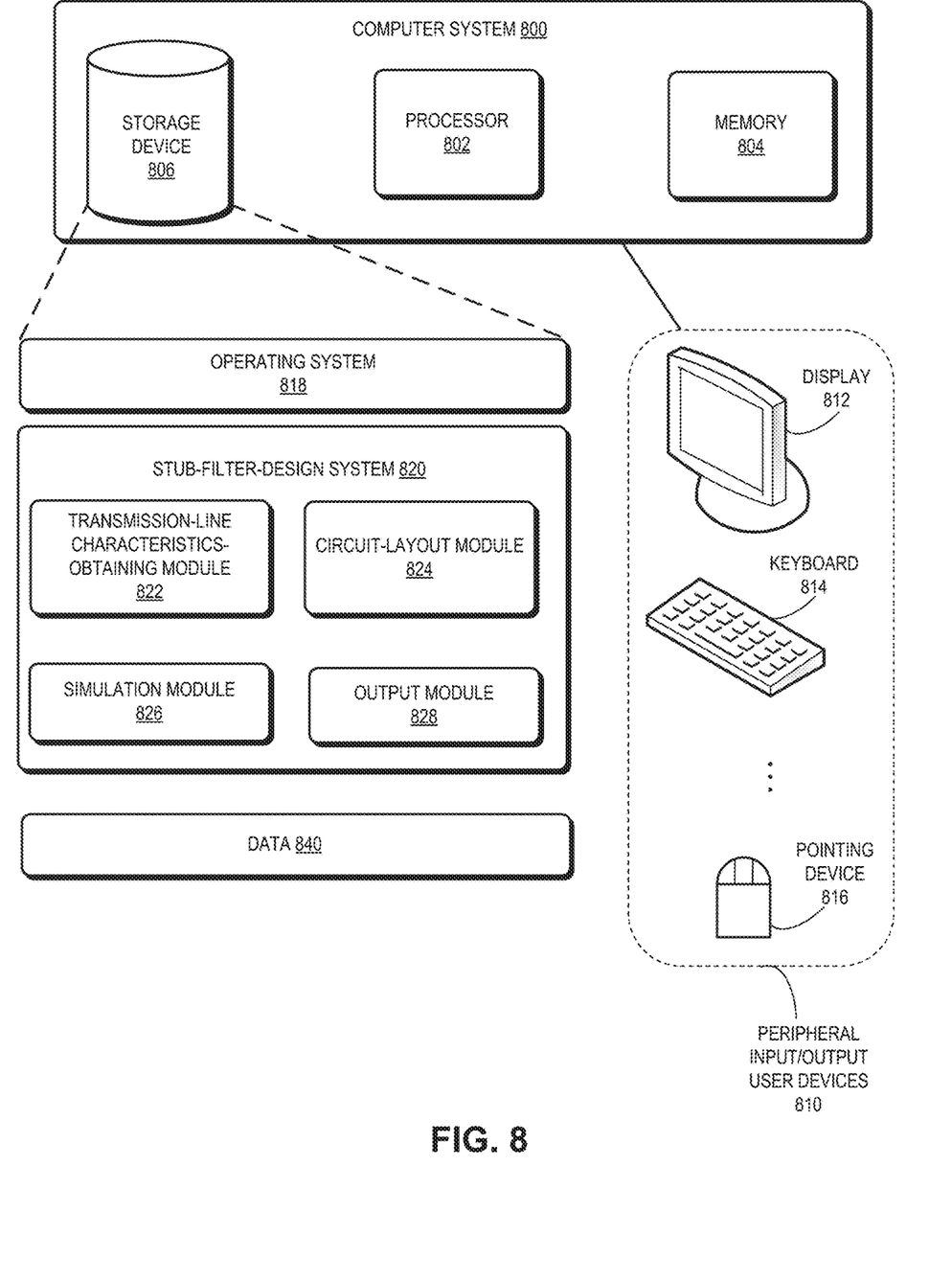
FIG. 8 illustrates an exemplary computer system that facilitates the design of stub filters, according to one aspect of this application.

FIG. 8 illustrates an exemplary computer system that facilitates the design of stub filters, according to one aspect of this application. Computer system 800 includes a processor 802, a memory 804, and a storage device 806. Furthermore, computer system 800 can be coupled to peripheral input/output (I/O) user devices 810, e.g., a display device 812, a keyboard 814, and a pointing device 816. Storage device 806 can store an operating system 818, a stub-filter-design system 820, and data 840.

Stub-filter-design system 820 can include instructions, which when executed by computer system 800, can cause computer system 800 or processor 802 to perform methods and/or processes described in this disclosure. Specifically, stub-filter-design system 820 can include instructions for obtaining characteristics of the transmission lines (transmission-line-characteristics-obtaining module 822), instructions for laying out the stub-filter circuit (circuit-layout module 824), instructions for simulating the stub filters to obtain the optimum stub lengths and pitch-between-stubs (simulation module 826), and instructions for outputting the circuit design to allow the fabrication of the stub filters (output module 828).

One aspect provides a printed circuit board (PCB). The PCB includes a transmission line to transmit signals of a desired frequency, a first stub coupled to the transmission line at a first location, and a second stub coupled to the transmission line at a second location. The first stub is to filter out signals of a first frequency, the second stub is to filter out signals of a second frequency, and the first and second stubs are positioned such that the insertion loss of the transmitted signals of the desired frequency is substantially minimized.

In a variation on this aspect, a length of the first stub substantially approximates to a quarter wavelength of the first frequency, and a length of the second stub substantially approximates to a quarter wavelength of the second frequency.

In a further variation, the first frequency is twice the desired frequency and the second frequency is three times the desired frequency.

In a further variation, a distance between the first and second locations substantially approximates to a sum of the length of the first stub and the length of the second stub.

In a variation on this aspect, the transmission line and the first or second stub are positioned on different layers of the PCB, and the first or second stub is coupled to the transmission line by a via.

In a variation on this aspect, the transmission line and the first and second stubs are positioned on a same layer of the PCB, a respective stub is "L" shaped. A first segment of the respective stub is coupled to the transmission line vertically, and a second segment of the respective stub and the transmission line are parallel to each other.

In a further variation, the L-shaped first and second stubs are positioned on different sides of the transmission line, and the L-shaped first and second stubs extend toward each other.

In a variation on this aspect, the transmission line is a single-ended transmission line or one of a pair of transmission lines.

In a variation on this aspect, the PCB is a motherboard comprising a socket for mounting a processing unit and a plurality of sockets for mounting a plurality of memory modules.

In a further variation, the transmission line couples the memory modules to the processing unit.

One aspect provides a motherboard. The motherboard includes a socket for mounting a processing unit, a plurality of sockets for mounting a plurality of memory modules, and a transmission line coupling the memory modules to the processing unit, wherein the transmission line is to transmit signals of a desired frequency. The motherboard also includes a first stub coupled to the transmission line at a first location and a second stub coupled to the transmission line at a second location. The first stub is to filter out signals of a first frequency, the second stub is to filter out signals of a second frequency, and the first and second stubs are positioned such that an insertion loss of the transmitted signals of the desired frequency is substantially minimized.

In a variation on this aspect, a length of the first stub substantially approximates to a quarter wavelength of the first frequency, and a length of the second stub substantially approximates to a quarter wavelength of the second frequency.

In a variation on this aspect, the first frequency is twice the desired frequency and the second frequency is three times the desired frequency.

In a further variation, a distance between the first and second locations substantially approximates to a sum of the length of the first stub and the length of the second stub.

In a variation on this aspect, the transmission line and the first or second stub are positioned on different layers of the motherboard, and the first or second stub is coupled to the transmission line by a via.

In a variation on this aspect, the transmission line and the first and second stubs are positioned on a same layer of the motherboard, a respective stub is "L" shaped, a first segment of the respective stub is coupled to the transmission line vertically, and a second segment of the respective stub and the transmission line are parallel to each other.

In a further variation, the L-shaped first and second stubs are positioned on different sides of the transmission line, and the L-shaped first and second stubs extend toward each other.

In a variation on this aspect, the transmission line is a single-ended transmission line or one of a pair of transmission lines.

In a variation on this aspect, the memory modules include one or more of: a double data rate 4 (DDR4) dual in-line memory module (DIMM) and a DDR5 DIMM.

In a variation on this aspect, the insertion loss of the transmitted signals of the desired frequency is at least 10 dB higher than that of the signals of the first or second frequency.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions of examples have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. A circuit board comprising:
   a pair of differential transmission lines to transmit signals of a given frequency, the pair of differential transmission lines comprising a first transmission line and a second transmission line;
   a first stub connected to the first transmission line at a first location, wherein the first stub is to filter out signals of a first frequency;
   a second stub connected to the first transmission line at a second location, wherein the second stub is to filter out signals of a second frequency, wherein the first and second stubs are connected to the first transmission line at the first and second locations along the first transmission line such that an insertion loss of the transmitted signals of the given frequency is less than insertion losses of the signals of the first frequency and the signals of the second frequency;

a third stub connected to the second transmission line at a third location, wherein the third stub is to filter out the signals of the first frequency; and a fourth stub connected to the second transmission line at a fourth location, wherein the fourth stub is to filter out the signals of the second frequency, wherein the pair of differential transmission lines is bent such that a first segment of the pair of differential transmission lines has a bent angle relative to a second segment of the pair of differential transmission lines, wherein the first and second stubs are connected to the first transmission line in the first segment, and the third and fourth stubs are connected to the second transmission line in the second segment.

2. The circuit board of claim 1, wherein a first length of the first stub is based on a quarter wavelength of the first frequency, and wherein a second length of the second stub is based on a quarter wavelength of the second frequency, the first length being different from the second length.

3. The circuit board of claim 2, wherein the first frequency is twice the given frequency, and the second frequency is three times the given frequency.

4. The circuit board of claim 1, wherein the first transmission line and the first or second stub are in different layers of the circuit board, and wherein the first or second stub is connected to the first transmission line by a via.

5. The circuit board of claim 1, wherein the first transmission line and the first and second stubs are in a same layer of the circuit board, wherein a respective stub of the first and second stubs is L-shaped, and wherein a first segment of the respective stub is connected to the first transmission line and is angled relative to the first transmission line, and wherein a second segment of the respective stub is parallel to the first transmission line.

6. The circuit board of claim 5, wherein each of the first and second stubs is L-shaped, and the L-shaped first and second stubs are positioned on different sides of the first transmission line, and wherein the L-shaped first and second stubs extend toward each other.

7. The circuit board of claim 1, wherein the first frequency is twice the given frequency, and a first length of a first stub filter including the first stub is a quarter wavelength of the first frequency, wherein the second frequency is three times the given frequency, and a second length of a second stub filter including the second stub is a quarter wavelength of the second frequency, and wherein a distance between the first and second locations is a sum of the first length of the first stub filter and the second length of the second stub filter.

8. The circuit board of claim 1, comprising a first socket for mounting a processing unit and a plurality of sockets for mounting a plurality of memory modules, and wherein the pair of differential transmission lines is part of a bus connecting the first socket and the plurality of sockets.

9. The circuit board of claim 1, wherein the insertion loss of the transmitted signals of the given frequency is less than 1 decibel (dB).

10. The circuit board of claim 9, wherein the insertion losses of the signals of the first frequency and the signals of the second frequency is greater than 30 dB.

11. The circuit board of claim 1, wherein a difference between a return loss at the given frequency and a return loss at the first frequency or the second frequency is greater than 10 dB.

12. The circuit board of claim 1, wherein the first and second stubs are located on a first side of the pair of differential transmission lines, and the third and fourth stubs are located on an opposite second side of the pair of differential transmission lines.

13. A circuit board comprising:

a transmission line to transmit signals of a given frequency;

a first stub filter connected to the transmission line at a first location, wherein the first stub filter is to filter out signals of a first frequency, wherein the first frequency is twice the given frequency, and wherein a first length of the first stub filter is a quarter wavelength of the first frequency; and a second stub filter connected to the transmission line at a second location, wherein the second stub filter is to filter out signals of a second frequency, wherein the second frequency is three times the given frequency, and wherein a second length of the second stub filter is a quarter wavelength of the second frequency, wherein the first and second stub filters are connected to the transmission line at the first and second locations along the transmission line such that an insertion loss of the transmitted signals of the given frequency is less than insertion losses of the signals of the first frequency and the signals of the second frequency, and wherein a distance between the first and second locations is a sum of the first length of the first stub filter and the second length of the second stub filter.

14. The circuit board of claim 13, wherein the transmission line is a first transmission line of a pair of differential transmission lines, and wherein the pair of differential transmission lines further comprises a second transmission line, the circuit board further comprising:

a third stub filter connected to the second transmission line at a third location, wherein the third stub filter is to filter out the signals of the first frequency; and a fourth stub filter connected to the second transmission line at a fourth location, wherein the fourth stub filter is to filter out the signals of the second frequency.

15. The circuit board of claim 13, wherein the first stub filter includes a first stub, and the second stub filter includes a second stub, and wherein a respective stub of the first and second stubs is L-shaped, and wherein a first segment of the respective stub is connected to the transmission line and is angled relative to the transmission line, and wherein a second segment of the respective stub is parallel to the transmission line.

16. The circuit board of claim 15, wherein each of the first and second stubs is L-shaped, and the L-shaped first and second stubs are positioned on different sides of the transmission line, and wherein the L-shaped first and second stubs extend toward each other.

17. The circuit board of claim 13, wherein the first stub filter includes a first stub and a via connecting the transmission line to the first stub, and the second stub filter includes a second stub and a via connecting the transmission line to the second stub.

18. A circuit board comprising:

a first socket for mounting a processing unit;

a plurality of sockets for mounting a plurality of memory modules;

a bus comprising a pair of differential transmission lines comprising a first transmission line and a second transmission line, the bus connecting the first socket and the plurality of sockets, wherein the bus is to transmit signals of a given frequency;

a first stub connected to the first transmission line at a first location, wherein the first stub is to filter out signals of a first frequency;

a second stub connected to the first transmission line at a second location, wherein the second stub is to filter out signals of a second frequency, wherein the first and second stubs are connected to the first transmission line at the first and second locations along the first transmission line such that an insertion loss of the transmitted signals of the given frequency is less than insertion losses of the signals of the first frequency and the signals of the second frequency;

a third stub connected to the second transmission line at a third location, wherein the third stub is to filter out the signals of the first frequency; and a fourth stub connected to the second transmission line at a fourth location, wherein the fourth stub is to filter out the signals of the second frequency, wherein the pair of differential transmission lines is bent such that a first segment of the pair of differential transmission lines has a bent angle relative to a second segment of the pair of differential transmission lines, wherein the first and second stubs are connected to the first transmission line in the first segment, and the third and fourth stubs are connected to the second transmission line in the second segment.

19. The circuit board of claim 18, wherein the first and second stubs are located on a first side of the pair of differential transmission lines, and the third and fourth stubs are located on an opposite second side of the pair of differential transmission lines.

20. The circuit board of claim 18, wherein the first frequency is twice the given frequency, and a first length of a first stub filter including the first stub is a quarter wavelength of the first frequency, wherein the second frequency is three times the given frequency, and a second length of a second stub filter including the second stub is a quarter wavelength of the second frequency, and wherein a distance between the first and second locations is a sum of the first length of the first stub filter and the second length of the second stub filter.

* * * * *